United States Patent
Furuya et al.

(10) Patent No.: US 6,504,444 B1
(45) Date of Patent: *Jan. 7, 2003

(54) HIGH FREQUENCY INTEGRATED CIRCUIT INCLUDING AN ISOLATOR AND DIELECTRIC FILTER

(75) Inventors: Mitsuru Furuya, Tokyo (JP); Osamu Myohga, Tokyo (JP); Yoshitsugu Okada, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/187,868

(22) Filed: Nov. 6, 1998

(30) Foreign Application Priority Data

Nov. 7, 1997 (JP) .............................. 9-306011

(51) Int. Cl.⁷ ........................... H01P 1/36; H01P 1/387
(52) U.S. Cl. ................... 333/1.1; 333/24.2; 333/219.1
(58) Field of Search ............... 333/1.1, 24.2, 333/204, 219.1; 29/832

(56) References Cited

U.S. PATENT DOCUMENTS

| | | | | |
|---|---|---|---|---|
| 3,611,196 A | * | 10/1971 | Tornesch et al. | 333/1.1 |
| 4,714,903 A | * | 12/1987 | Brand | 333/204 X |
| 4,740,762 A | * | 4/1988 | Powers et al. | 333/1.1 |
| 5,986,520 A | * | 11/1999 | Abeno et al. | 333/134 |
| 6,016,090 A | * | 1/2000 | Iio et al. | 333/219.1 |
| 6,127,907 A | * | 10/2000 | Furuya et al. | 333/235 |

FOREIGN PATENT DOCUMENTS

| | | |
|---|---|---|
| GB | 1 512 605 | 8/1976 |
| JP | 59-74703 | 4/1984 |
| JP | 59-194504 | 11/1984 |
| JP | 60-4308 | 1/1985 |
| JP | 61-288486 | 12/1986 |
| JP | 62-269801 | 11/1988 |
| JP | 64-77301 | 3/1989 |
| JP | 2-244786 | 9/1990 |
| JP | 5-167347 | * 7/1993 |
| JP | 5-251834 | 9/1993 |
| JP | 6-334413 | 12/1994 |
| JP | 7-58505 | 3/1995 |
| JP | 7-283497 | 10/1995 |

OTHER PUBLICATIONS

Weiss et al., *New Self Biased Circulators,* Applied Microwave pp. 74–85, Fall 1990.*

Schloemann, "Circulators for Microwave and Millimeter-—Wave Integrated Circuits," Feb. 1988, Proceedings of the IEEE, vol. 76, No. 2.*

* cited by examiner

Primary Examiner—Justin P. Bettendorf
(74) Attorney, Agent, or Firm—Choate, Hall & Stewart

(57) ABSTRACT

Holes are formed in a ceramic substrate before sintering, magnetic parts and dielectric parts are fitted in the holes and the substrate is sintered at a temperature equal to or lower than the sintering temperature of the magnetic parts. It is possible to obtain a very compact high frequency integrated circuit, particularly, a micro wave integrated circuit which can be utilized in a frequency band of several tens GHz, by using hard ferrite as a material of the magnetic parts and magnetizing them after the sintering.

10 Claims, 2 Drawing Sheets

HIGH FREQUENCY INTEGRATED CIRCUIT INCLUDING AN ISOLATOR AND DIELECTRIC FILTER

CROSS REFERENCE TO RELATED APPLICATIONS

The present invention claims priority from Japanese Patent Application No.9-306011 filed Nov. 7, 1997, the contents of which are incorporated herein by reference.

BACKGROUND OF THE INVENTION

1. Field of the Invention

The present invention relates to a micro wave integrated circuit (MIC) having a plurality of circuit parts mounted on a ceramic substrate and a method for manufacturing the same integrated circuit. The present invention is utilized in a communication equipment, radar, measuring equipment or other equipment. Particularly, the present invention is utilized in a filter circuit, an isolator, a transmission/receiving separating circuit, an antenna circuit or other circuits of this type of equipment. Although the present invention was developed for utilization thereof in a high frequency circuit operating at a frequency exceeding 10 GHz, the utilizing frequency is not limited thereto and the present invention can be utilized in a circuit operating at a frequency higher than 10 GHz.

2. Description of Related Art

A technique for forming a micro wave integrated circuit having a plurality of circuit parts mounted on a ceramic substrate by soldering or ribbon or wire connection has been known. Although it is usual to form conductors of a circulator, among the circuit parts mounted on a ceramic substrate, on a soft ferrite substrate, Japanese Patent Application Laid-open No. Hei 61-288486 discloses a technique in which holes are formed in a green sheet of an alumina substrate which is to be sintered at low temperature, ferrite parts are fitted in these holes and the green sheet is sintered to fixedly secure the ferrite parts in the holes.

This technique is a useful technique in mounting ferrite parts in a ceramic substrate and the present invention is based on this technique. However, this technique is to form a circulator part by mounting a ferrite unit on a low temperature sintered alumina substrate and does not suggest a technique for arranging a plurality of mutually related circuit parts on a low temperature sintered alumina substrate to unify them as an integrated circuit. Further, the disclosed technique does not suggest a use of hard ferrite as the ferrite material and a magnetization of the hard ferrite correspondingly to circuit characteristics after sintering.

On the other hand, Japanese Patent Application Laid-open No. Hei 6-334413 of the same assignee as that of the present invention discloses a technique for unifying a high frequency filter as a monolithic micro wave integrated circuit. According to this technique, an insulating film is formed on a surface of a semiconductor substrate and conductor lines are formed on the insulating film. Further, a dielectric resonator is mounted in the vicinity of the conductor lines. The dielectric resonator is fitted in a recess formed in the insulating film.

However, according to this technique, it is impossible to unify a conventional circulator using soft ferrite.

On the other hand, a high frequency band exceeding 10 GHz has been used in various equipment. Particularly, a frequency of an automobile radar or a distance meter is assigned to a 60 GHz band or a 70 GHz band. Therefore, in view of limited space in which such a device is mounted, a technique for mass-producing a compact high frequency integrated circuit having uniform characteristics at low cost is required. In the conventional MIC technology, however, an area for connecting such parts as a circulator, high frequency filter and MMIC, etc., is necessary, with which there is a limitation in reducing the size of the device.

In reducing the size of the device, the conventional technique is basically superior in forming a high frequency filter integrally with the MMIC. However, the integration of a conventional circulator with the MMIC is impossible in principle since the conventional circulator requires an external magnet. Further, in order to obtain uniform characteristics according to the conventional MIC technology, the parts themselves must have stable characteristics. Even if such parts are obtained, loss which can not be considered in the design stage of the device may occur in connecting portions of the parts and it is impossible to control such loss, so that there may occur variation of characteristics between substrates. Therefore, it is necessary to regulate the characteristics of the device after it is assembled, the number of working steps is increased and skilled workers are necessary for the regulation of the characteristics of the device.

SUMMARY OF THE INVENTION

The present invention was made in view of the above background and has an object to provide a micro wave integrated circuit (MIC) including dielectric parts and magnetic parts both formed on a single substrate and a method for manufacturing the same.

Another object of the present invention is to provide a reliable high frequency integrated circuit having substantially no power loss at connecting points which is the problem in the structure in which individual parts are connected and a method for manufacturing the same high frequency integrated circuit.

Another object of the present invention is to provide a high frequency integrated circuit which has stable characteristics and is capable of being manufactured uniformly and a method for manufacturing the same high frequency integrated circuit.

Another object of the present invention is to provide a high frequency integrated circuit capable of being manufactured with a small number of manufacturing steps and a method of manufacturing the same high frequency integrated circuit.

A further object of the present invention is to provide a high frequency integrated circuit which can be mass-produced at low cost and a method of manufacturing the same high frequency integrated circuit.

Another object of the present invention is to provide a high frequency integrated circuit which is suitable for use in designing and manufacturing a filter or an antenna circuit which can be utilized in several tens GHz frequency band and a method for manufacturing the same high frequency integrated circuit.

A further object of the present invention is to provide a high frequency integrated circuit whose electric characteristics can be reversibly regulated while monitoring the characteristics thereof after manufacture and a method for manufacturing the same high frequency integrated circuit.

According to a first aspect of the present invention, a high frequency integrated circuit is featured having a structure in which magnetic parts or magnetic parts and dielectric parts are unified in a single integrated circuit substrate and in which two or more of these circuit parts form desired high frequency characteristics. That is, a plurality of parts constructing an isolator, a circulator or a filter are constituted as a circuit having high frequency characteristics as a whole. A conductor pattern is formed on a surface of the ceramic substrate as lead lines of the circuit or as micro strip lines.

The magnetic parts may be of hard ferrite. The hard ferrite can be utilized as a constructive element of a circulator or an isolator. Further, the dielectric parts can be utilized as constructive elements of a high frequency filter. The dielectric substrate may be of organic material and, particularly, polytetrafluoroethylene is a suitable material thereof. The dielectric substrate is preferably a ceramic substrate.

According to a second aspect of the present invention, a method for manufacturing a high frequency integrated circuit, which is featured by comprising, in a case where the dielectric substrate is a glass ceramic substrate, the steps of forming a plurality of holes in a green sheet of the glass ceramic, fitting circuit parts in the respective holes, forming the ceramic substrate by sintering the green sheet at a temperature not higher than a temperature at which the circuit parts are deformed and not lower than a sintering temperature of the green sheet and fixedly securing the circuit parts in the ceramic substrate by utilizing the shrinking nature of the holes during the sintering process of the ceramic substrate. The circuit pats include magnetic parts and dielectric parts and these parts are unified in a single substrate. The sintering temperature of the ceramic substrate is preferably in a range from 800° C. to 1200° C.

The height of the circuit part is not smaller than a thickness of the ceramic substrate and the hole is circular. An outer configuration of at least a portion of the circuit part is preferably a circular rod.

When some of the magnetic parts are of hard ferrite, the sintering temperature of the green sheet is not higher than the sintering temperature of the hard ferrite and the magnetic parts of hard ferrite are magnetized by applying magnetic field thereto after the sintering of the ceramic substrate.

The Curie temperature of hard ferrite is within a range from 400° C. to 700° C. depending upon the nature thereof and the magnetizing step is preferably performed during a cooling period for cooling the substrate from about Curie temperature to room temperature after the sintering of the ceramic substrate is completed. It is, of course, possible to perform the magnetization or demagnetization of the magnetic parts or to regulate the magnetized state after the ceramic substrate is cooled to room temperature. In the magnetizing step, the electric characteristics of the integrated circuit is preferably regulated while monitoring it by regulating magnetic field applied to the magnetic parts of hard ferrite.

A plurality of holes are formed in the glass ceramic substrate in a green sheet state before sintering by punching and the circuit parts are fitted in the respective holes. Then, the substrate is sintered. By forming the holes by punching, the holes can be in a uniform and precise mutual positional relation. Since the green sheet is shrunken by sintering, the mutual positional relation of the holes is regulated by testing a plurality of samples such that the final configuration of the green sheet after sintering becomes a desired one. Once the mutual positional relation of the holes is regulated, it is possible to produce a large number of integrated circuits having identical configuration without necessity of regulating it individually.

The size of hole formed in the green sheet is also regulated by testing a plurality of samples such that the magnetic parts and the dielectric parts are rigidly secured to the holes after sintering. Once the size of hole is regulated, it is possible to produce a large number of integrated circuits uniformly.

The height of the circuit part (length of the parts measured in a vertical direction from the ceramic substrate surface) is preferably equal to or larger than the thickness of the substrate. Particularly, the height of the magnetic part is preferably the same as the thickness of the substrate, since it is usual to form a conductor between the magnetic part and the substrate and the characteristics of the integrated circuit may be degraded if there is a step in the conductor. When the height of the dielectric part is larger than the thickness of the substrate, it is also possible to machine it. In such case, the freedom of configuration of the part becomes large and it becomes possible to design various circuits.

It is most preferable to make the hole provided in the green sheet circular and at least a portion of the circuit part which is to be fitted in the hole circular rod since the tightening force of the hole with respect to the rod portion of the circuit part becomes uniform. The outer configuration of the circuit part may be other than circular rod, such as ellipsoidal. In such case, the number of tests to be performed in order to make the firm tightening optimal may be increased.

By using hard ferrite as the material of the magnetic parts, the external magnet becomes unnecessary. When an isolator or a circulator is realized by applying a magnetic field to a magnetic element thereof by the external magnet in a high frequency integrated circuit operating in a frequency band of several tens GHz, the magnetic field may influence other elements close to the aimed magnetic element since the integrated circuit is small and the inter-element distance is small, so that the mutual relation becomes complex, causing the design thereof to be difficult. However, by using the hard ferrite, the influence of magnetic field on other elements is minimized and it becomes possible to realize a desired characteristics by a relatively simple design.

The sintering temperature of the green sheet should be selected such that it changes the natures of the magnetic parts, particularly, the hard ferrite. According to experiments conducted by the inventors, it has been found that, even in a case where the sintering is performed at a temperature equal to or higher than Curie temperature of hard ferrite, desired characteristics can be obtained by lowering the temperature after the sintering is completed and regulating the magnetic orientation again by applying magnetic field to the hard ferrite when the temperature of the hard ferrite becomes about the Curie temperature or lower than the Curie temperature. Since the sintering temperature and the Curie temperature of hard ferrite is not uniform depending upon the kind of ferrite, the temperature in the sintering step and the temperature in the magnetizing step are selected according to the nature of the hard ferrite. It is not always necessary to set the sintering temperature equal to or higher than the Curie temperature of hard ferrite.

When the magnetization is performed after the sintering is completed, it may be possible to magnetize after the sample temperature becomes room temperature. However, it is easily possible to magnetize the magnetic part to a desired value when the magnetization is performed while lowering the temperature from a relatively high temperature. It is further possible to change the magnetizing state while monitoring the characteristics of the high frequency circuit by operating the high frequency circuit after being magnetized once.

BRIEF DESCRIPTION OF THE DRAWINGS

The above mentioned and other objects, features and advantages of the present invention will become more apparent by reference to the following detailed description of the invention taken in conjunction with the accompanying drawings, in which.

DETAILED DESCRIPTION OF THE PREFERRED EMBODIMENTS

Figure 1:
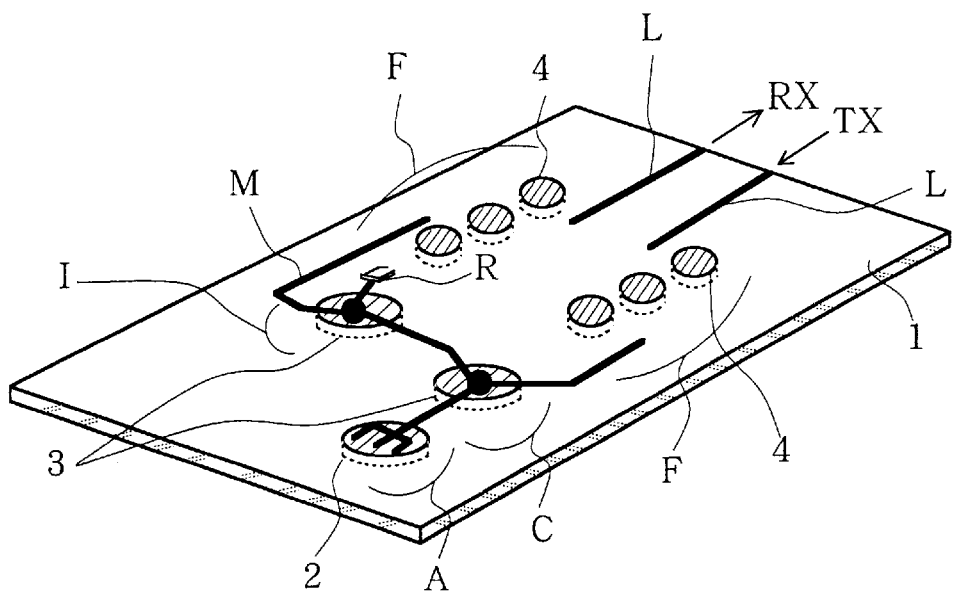
FIG. 1 is a perspective view showing a whole construction of a high frequency integrated circuit according to an embodiment of the present invention.

FIG. 1 is a perspective view showing a whole construction of a high frequency integrated circuit according to an embodiment of the present invention. In this embodiment, an input/output circuit of a radar transmitter/receiver is formed on a glass ceramic substrate of a size 18×11×0.3 mm. The input/output circuit of this radar transmitter/receiver is mounted on a front portion of a car and adapted to measure a distance between the car and a preceding car. The frequency in 60~70 GHz band (wavelength 4.3~5.0 mm) is assigned to such automobile radar.

As shown in FIG. 1, a dielectric part 2, two magnetic parts 3 and two sets of three dielectric parts 4 are buried in a glass ceramic substrate 1. Further, micro strip lines L and electrodes M of a metal, that is, gold, are also formed on a surface of the substrate.

Figure 2:
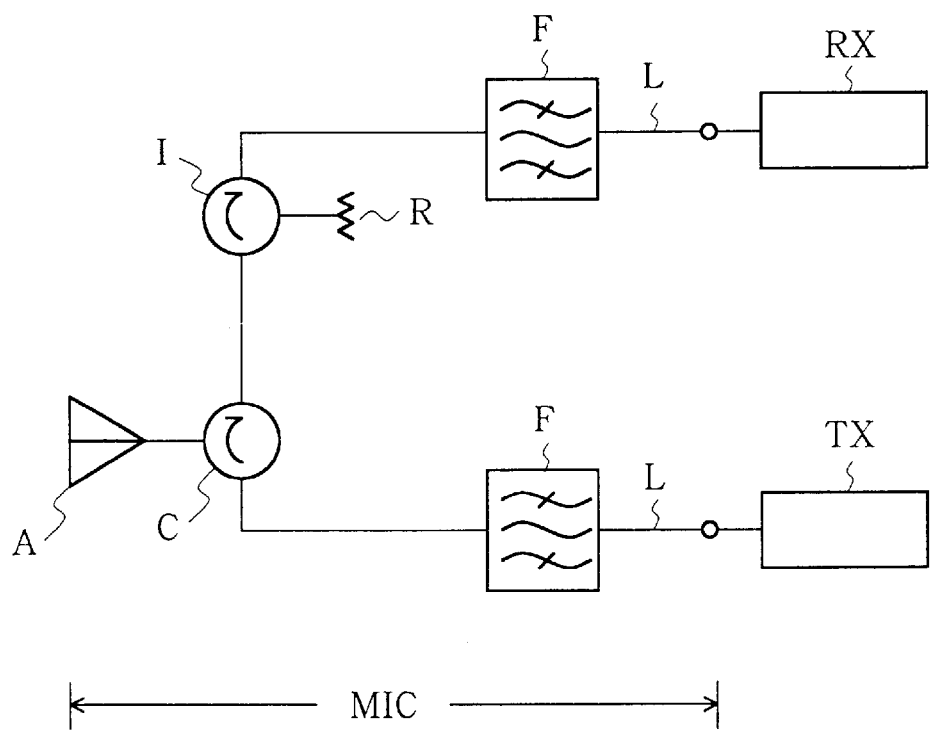
FIG. 2 is an equivalent block circuit diagram of the high frequency integrated circuit shown in FIG. 1.

FIG. 2 is an equivalent circuit of the embodiment shown in FIG. 1. A portion of the circuit indicated by MIC in FIG. 2 is an integrated circuit formed on the substrate shown in FIG. 1. Describing this circuit with reference to FIG. 2, an electromagnetic wave in 60 GHz band generated by a transmitter portion RX is supplied to the micro strip lines L, a spurious wave thereof is removed by a band-pass filter F and supplied to a first terminal of a circulator C. The circulator C supplies the signal at its first terminal to an antenna A through a second terminal thereof. This signal from the antenna A is transmitted as electromagnetic wave.

A receiving electromagnetic wave (reflected wave in a case of a radar) input to the antenna A is input to the second terminal of the circulator C and output to a third terminal thereof. A first terminal of an isolator I is connected to the third terminal of the circulator C. The isolator I outputs the signal input to the first terminal to a second terminal thereof. A terminating resistor R having a value equal to a characteristic impedance of this circuit is connected to a third terminal of the isolator I. Noise component of the output signal at the second terminal of the isolator I is removed by another band-pass filter F, passes through the micro strip lines L and is supplied to an input terminal of a receiver portion RX.

The circulator C supplies the signal at its first terminal to the second terminal thereof and does not supply the signal at the second terminal to the first terminal. The circulator C supplies the signal at its second terminal to the third terminal thereof and does not supply the signal at the third terminal to the second terminal. The isolator I supplies the signal at its first terminal to the second terminal. The signal at the second terminal of the isolator I is absorbed by the terminating resistor R and can not be supplied to the first terminal. Such working of the circulator C and the isolator I are realized by the magnetic parts as well known.

Each of the circulator C and the isolator I shown in FIG. 2 is formed by providing a metal electrode on one of the magnetic parts 3. The antenna A is formed by forming a metal electrode on the dielectric part 2. Further, the band-pass filter F is formed by one set of three dielectric parts 4. The terminating resistor R is formed by a resistance member provided on the surface of the substrate 1.

Figure 3:
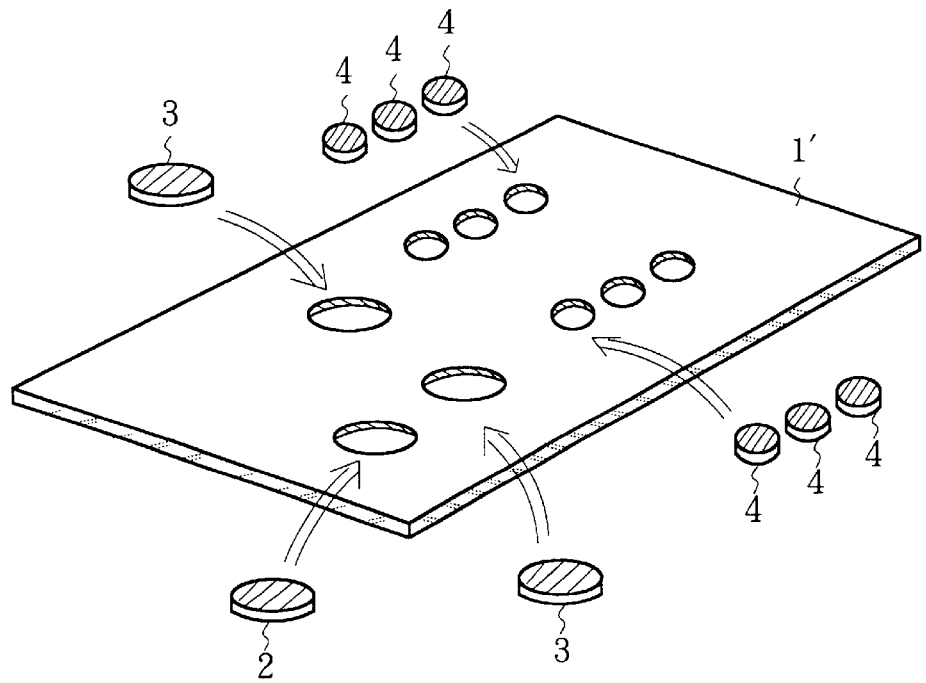
FIG. 3 is a perspective view illustrating an assembling of magnetic parts and dielectric parts to a green sheet of the high frequency integrated circuit shown in FIG. 1.
Figure 4:
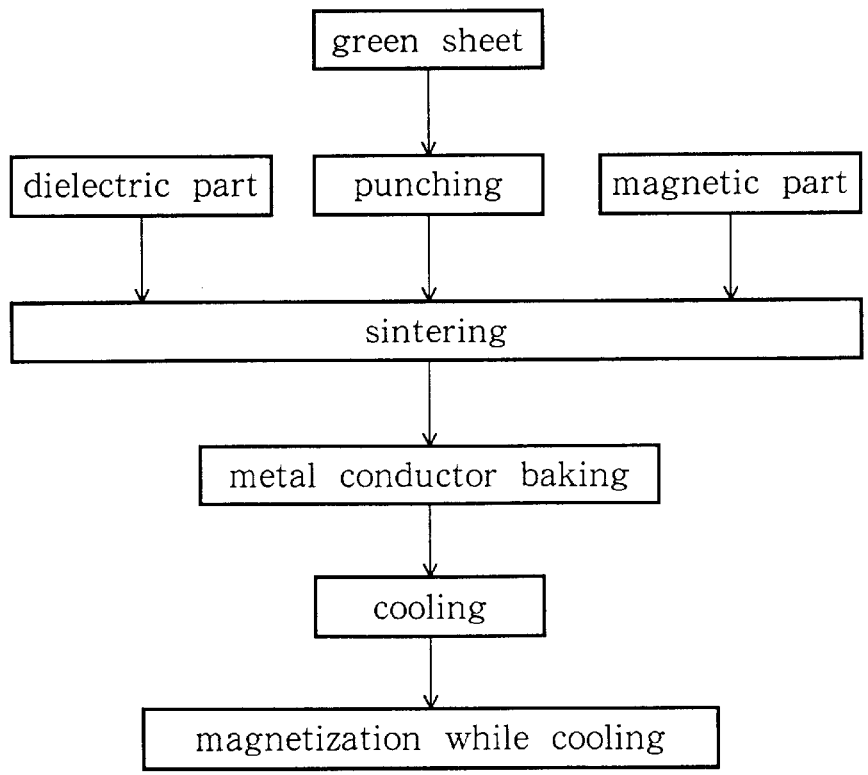
FIG. 4 is a flowchart of a manufacture of the high frequency integrated circuit of the present invention.

FIG. 3 is a perspective view illustrating an assembling of the magnetic parts and the dielectric parts to a green sheet of the high frequency integrated circuit shown in FIG. 1 and FIG. 4 is a flowchart of a manufacture of the high frequency integrated circuit of the present invention. As shown in FIG. 3, the glass ceramic substrate 1' in the form of a green sheet before sintering is punched to form holes and a circular ceramic dielectric rod as the dielectric part 2, circular hard ferrite rods as the magnetic parts 3 and circular ceramic dielectric rods as the dielectric parts 4 are fitted in the holes. Then, the green sheet is sintered as shown in FIG. 4. The sintering temperature of the green sheet is lower than the sintering temperature of the hard ferrite. In detail, in this embodiment, the sintering temperature of the green sheet is controlled to about 870° C. After the temperature of the green sheet is cooled to room temperature after the sintering is completed, a conductor pattern of gold paste is printed on the surface of the glass ceramic substrate 1 by using a printing mask and the pattern is close adhered to the substrate surface and surfaces of the magnetic and dielectric parts by baking it at about 850° C. After the baking, the substrate is naturally cooled in air and, when its surface temperature becomes about 600° C., a magnetic field is applied to the magnetic parts 3 to magnetize them while being cooled.

A plurality of the high frequency integrated circuits each prepared as mentioned above were acceptable in physical structure. With the filter portion of the high frequency integrated circuit, ripple of the frequency-gain characteristics in the pass band is reduced by about 1~2 dB compared with the conventional case in which the dielectric elements are arranged by using adhesive and, thus, the pass band characteristics are flattened.

The effect of the circulator portion of the high frequency integrated circuit with the hard ferrite parts magnetized without using any external magnet was studied in detail. As a result, the isolation band width was 2.5 GHz~1.9 GHz for 5 samples whose metal conductor sizes were changed such that the operating center frequency of the circulator becomes in a range from 55 GHz to 64 GHz.

As comparative examples, 3 samples each having similar construction to the conventional structure and using soft ferrite according to the conventional technique were prepared and similar measurements were performed by applying a magnetic field to magnetic parts by an external samarium-cobalt magnet in the form of a circular rod in contact with a rear surface of the substrates. As a result of the measurements, the isolation band width was 0.8~0.9 GHz. Therefore, it is clear that the present invention in which the hard ferrite magnetic parts are magnetized provides the isolation effect in a band width which is twice to three times the band width covered by the conventional technique.

Now, a case where the substrate 1 of the high frequency integrated circuit shown in FIG. 1 is of not glass ceramic but an organic material will be described. The circuit construction and operation are the same as those mentioned previously and, therefore, details thereof are omitted for avoidance of duplication.

According to a first embodiment of the method for manufacturing the high frequency integrated circuit, holes each having a diameter larger than a diameter of a cylindrical part to be buried in a substrate of polytetrafluoroethylene by about 0.05~0.1 mm are formed in the substrate. Adhesive is applied to inner walls of these holes by painting and magnetic parts and/or dielectric parts are fitted in and secured to the holes. Thereafter, metal conductors are formed on one surface of the substrate by plating such that the positional relation of the respective parts becomes desirable.

According to a second embodiment of the method, magnetic parts are attached on a metal foil by using electrically conductive adhesive and dielectric parts are attached thereon by using an electrically conductive adhesive or an electrically insulating adhesive. In this case, a height of the dielectric part is made equal to or larger than a height of the magnetic part. An organic resin is painted on the surface of the metal foil on which the magnetic parts and the dielectric parts are attached to a thickness equal to the height of the magnetic parts and the organic substrate is formed by hardening the organic resin. Thereafter, metal conductors are formed on the surface of the substrate by plating such that a desired positional relation between the respective parts is obtained.

According to a third embodiment of the method, holes each having a diameter larger than a diameter of a cylindrical part to be buried in an organic substrate by about 0.05~0.1 mm are formed in the substrate. On the other hand, magnetic parts are attached on a metal foil by using electrically conductive adhesive and dielectric parts are attached thereon by using an electrically conductive adhesive or an electrically insulating adhesive. In this case, a height of the dielectric part is made equal to or larger than a height of the magnetic part. The parts attached to the metal foil are inserted into the holes, respectively, from one of surfaces of the organic substrate and the metal foil is adhered to the surface of the substrate by using an adhesive. In this case, the thickness of the substrate is selected such that surfaces of the magnetic parts become coplanar with the other surface of the substrate. Thereafter, metal conductors are formed on the other surface of the substrate by plating such that a desired positional relation between the respective parts is obtained.

As described hereinbefore, according to the present invention, it is possible to realize a high frequency integrated circuit capable of being used in a frequency region of 60 to 70 GHz band. The high frequency integrated circuit according to the present can provide uniform and stable characteristics and, when the present invention is applied to a mass-production of high frequency integrated circuit, it is possible to manufacture the high frequency integrated circuit at low cost. Particularly, the structure in which magnetization is performed for hard ferrite parts buried in a dielectric substrate without using an external magnet is very effective.

What is claimed is:

1. A high frequency integrated circuit, comprising:
   a dielectric substrate having a plurality of holes having a first thickness;
   a plurality of circuit parts having second thickness that is substantially equal to the first thickness including ceramic dielectric parts and hard ferrite parts substantially buried in respective ones of said plurality of holes, wherein said plurality of circuit parts are predominately held in the respective holes by a shrinkage of said dielectric substrate without an adhesive, said hard ferrite parts being magnetized in accordance with desired characteristics of said high frequency integrated circuit and at a temperature no higher than the Curie temperature of said hard ferrite parts, wherein at least two of said plurality of circuit parts are related to each other to provide a desired high frequency characteristic; and
   an electrically conductive pattern formed on a surface of said dielectric substrate.

2. The high frequency integrated circuit of claim 1, wherein said hard ferrite parts are magnetized at room temperature.

3. The high frequency integrated circuit of claim 1, wherein said high frequency integrated circuit includes an antenna formed from a metal electrode on one of said ceramic dielectric parts.

4. A high frequency integrated circuit as claimed in claim 1, wherein said magnetic parts are included in at least one of a circulator and an isolator.

5. A high frequency integrated circuit as claimed in claim 1, wherein at least one of said dielectric parts are included in a high frequency filter.

6. A high frequency integrated circuit as claimed in claim 1, wherein said dielectric substrate is of a ceramic material.

7. A high frequency integrated circuit, comprising:
   a dielectric substrate having a plurality of holes;
   a plurality of circuit parts substantially buried in respective ones of said plurality of hole wherein a height of said circuit parts is substantially equal to a thickness of said substrate, said plurality of circuit parts including at least one magnetic part and at least one dielectric part, said at least one magnetic part being of a hard ferrite material magnetized in accordance with at least one desired circuit characteristic of said high frequency integrated circuit and being magnetized at a temperature no greater than the Curie temperature of said hard ferrite, said magnetization occurring after the fabrication of the circuit and while the circuit is being electrically tested; and
   an electrically conductive pattern formed on a surface of said dielectric substrate
   wherein said dielectric substrate is of an organic material, and wherein said plurality of circuit parts are predominately held in the respective holes by an adhesive.

8. A high frequency integrated circuit as claimed in claim 7, wherein said organic material is polytetrafluoroethylene.

9. The high frequency integrated circuit of claim 7, wherein said plurality of circuit parts includes a magnetic part formed from hard ferrite being magnetized at room temperature.

10. The high frequency integrated circuit of claim 7, wherein said plurality of circuit parts of said high frequency integrated circuit includes an antenna formed from a metal electrode on a ceramic dielectric part.

* * * * *